US011978875B2

United States Patent
Nelson et al.

(10) Patent No.: US 11,978,875 B2
(45) Date of Patent: May 7, 2024

(54) SYSTEM FOR COOLING COMPONENTS ARRANGED WITHIN AN ENCLOSURE

(71) Applicant: NEC Energy Solutions, Inc., Westborough, MA (US)

(72) Inventors: Erik C. Nelson, Upton, MA (US); Scott Reitsma, Shrewsbury, MA (US); James S. Tela, Gardner, MA (US); Bryan Nelson, Upton, MA (US)

(73) Assignee: LG ENERGY SOLUTION, LTD., Seoul (KR)

( * ) Notice: Subject to any disclaimer, the term of this patent is extended or adjusted under 35 U.S.C. 154(b) by 642 days.

(21) Appl. No.: 15/397,256

(22) Filed: Jan. 3, 2017

(65) Prior Publication Data

US 2018/0191043 A1 Jul. 5, 2018

(51) Int. Cl.
*H01M 10/6563* (2014.01)
*H01M 6/50* (2006.01)
(Continued)

(52) U.S. Cl.
CPC ..... *H01M 10/6563* (2015.04); *H01M 6/5038* (2013.01); *H01M 10/613* (2015.04);
(Continued)

(58) Field of Classification Search
CPC .......... H01M 10/6563; H01M 10/613; H01M 6/5038; H01M 10/4271; H05K 7/20736
See application file for complete search history.

(56) References Cited

U.S. PATENT DOCUMENTS 6,034,873 A 3/2000 Stahl et al.
6,330,925 B1 * 12/2001 Ovshinsky ............... B60K 6/24
180/65.245
(Continued)

FOREIGN PATENT DOCUMENTS

EP 1 662 851 5/2006
EP 2348803 A1 7/2011
(Continued)

OTHER PUBLICATIONS

The American Heritage dictionary of the English Language (2022; https://www.ahdictionary.com/word/search.html?q=refrigeration (Year: 2022).*
(Continued)

*Primary Examiner* — Brian R Ohara
(74) *Attorney, Agent, or Firm* — Bryan Cave Leighton Paisner LLP

(57) ABSTRACT

A method of cooling a rack of heat dissipating components comprises cooling air, and porting the cooled air into a volume in front of the rack from above the volume. The method further comprises moving the cooled air from the volume in front of the rack to a plenum at a rear portion of the rack to pressurize the plenum. The cooled air is moved with an air mover disposed at a bottom portion of the rack, The method also comprises flowing air from the pressurized plenum past or through heat dissipating components in the rack to the volume in front of the rack, by force of pressure in the plenum through air-directing ports in the plenum. The air may be flowed through the heat dissipating components, around the heat dissipating components, or both. The method further comprises drawing warm air from an upper portion of the volume in front of the racks to cool it again.

16 Claims, 10 Drawing Sheets

(51) Int. Cl.
*H01M 10/42* (2006.01)
*H01M 10/613* (2014.01)
*H05K 7/20* (2006.01)

(52) U.S. Cl.
CPC ..... *H05K 7/20736* (2013.01); *H05K 7/20745* (2013.01); *H01M 2010/4271* (2013.01)

(56) References Cited

U.S. PATENT DOCUMENTS

| | | |
|---|---|---|
| 7,508,663 B2 | 3/2009 | Coglitore |
| 7,738,251 B2 | 6/2010 | Clidaras et al. |
| 7,857,688 B1 | 12/2010 | Cunningham et al. |
| 8,300,402 B2 | 10/2012 | Wei |
| 8,763,414 B2 | 7/2014 | Carlson et al. |
| 2002/0100579 A1 | 8/2002 | Heikkila et al. |
| 2003/0147216 A1 | 8/2003 | Patel |
| 2004/0183504 A1* | 9/2004 | Kimoto ............... H01M 2/1016 320/150 |
| 2006/0102322 A1 | 5/2006 | Madara |
| 2007/0074866 A1 | 4/2007 | Bhatti |
| 2007/0283710 A1 | 12/2007 | Gilbert et al. |
| 2010/0027216 A1 | 2/2010 | Matsushima et al. |
| 2011/0104548 A1* | 5/2011 | Saito .................... H01M 50/20 429/120 |
| 2012/0075794 A1 | 3/2012 | Wei et al. |
| 2012/0134105 A1 | 5/2012 | Chang |
| 2014/0011059 A1* | 1/2014 | Hashimoto ......... H01M 2/1077 429/72 |
| 2015/0140375 A1* | 5/2015 | Lee ....................... H01M 10/63 429/62 |

FOREIGN PATENT DOCUMENTS

| | | |
|---|---|---|
| FR | 2831019 | 4/2003 |
| JP | H0252493 | 4/1990 |
| JP | 2003139351 A | 5/2003 |
| JP | 2009/133617 | 6/2009 |
| JP | 2010061446 A | 3/2010 |
| JP | 2015125577 A | 7/2015 |
| TW | 201115082 | 5/2011 |
| WO | 2012075624 A1 | 6/2012 |

OTHER PUBLICATIONS

International Search Report and Written Opinion for PCT/US17/66952 dated May 8, 2018 entitled "A System for Cooling Components Arranged Within an Enclosure".
https://www.tripplite.com/applications/rack-cooling Watkins, C., "Data Center Cooling Efficiency" Tripp Lite, Jul. 13, 2006.
"Controlling the Temperature Inside Equipment Racks", Middle Atlantic Products, Reference guide, 2002-2010.

* cited by examiner

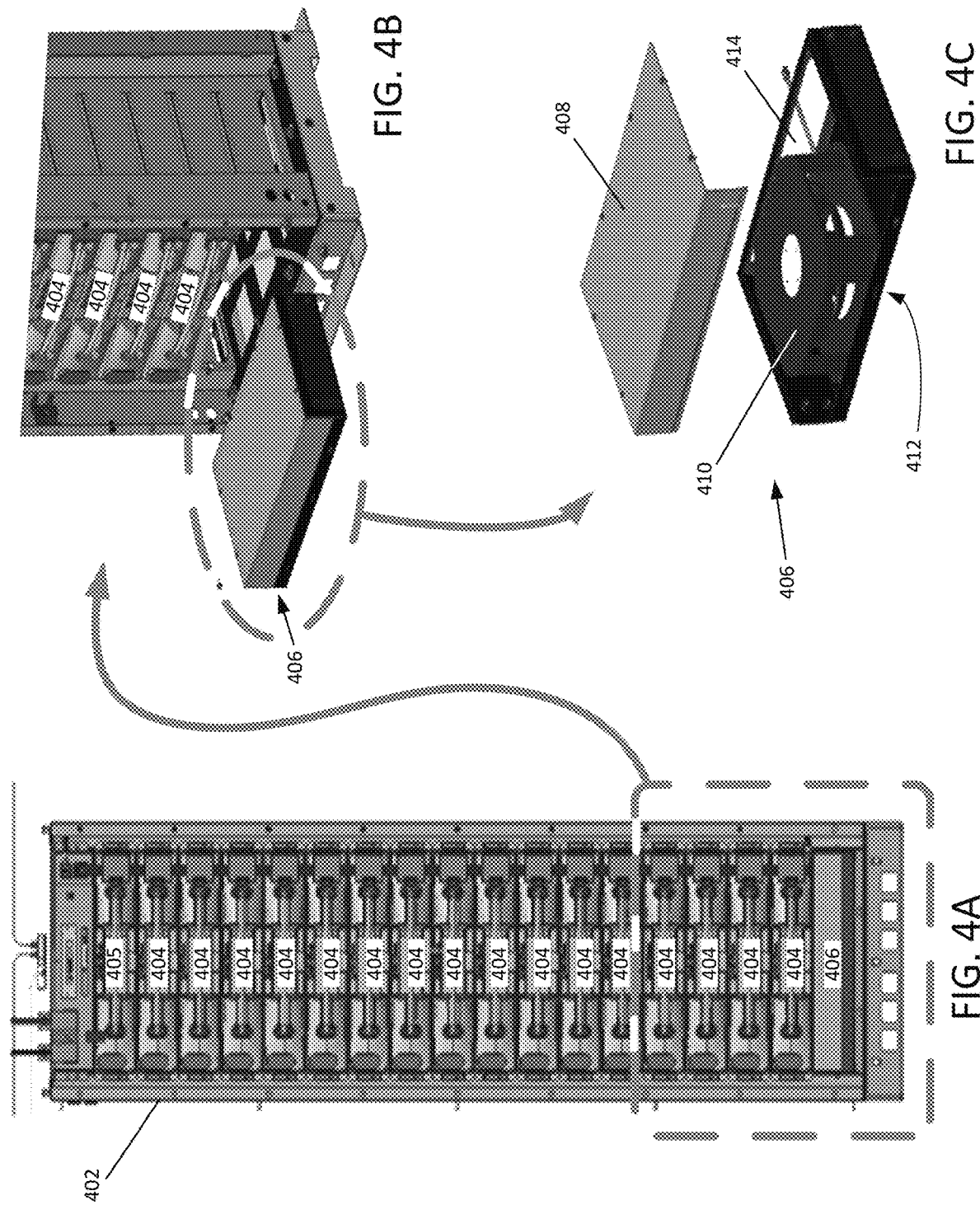

SYSTEM FOR COOLING COMPONENTS ARRANGED WITHIN AN ENCLOSURE

BACKGROUND

Various equipment operational scenarios may require a relatively large number of heat dissipating components or devices to be deployed within a particular area or volume. One example of such a scenario is a server cluster, which may include of one or more equipment racks deployed in a fixed space (i.e., a server room or building). Each equipment rack hosts a stack of processor modules, with each processor module functioning as a server (e.g., a print server or file server). The stacking of server modules within the rack may provide interconnection convenience among the modules, since cabling harnesses can be arranged along the rear area of the equipment rack into which the rear portions of the modules extend.

Another example of such a scenario is an energy storage system comprising a collection of energy storage devices within a fixed space (e.g. a building or purpose-built enclosure). An example of such a storage system is described in U.S. Patent Publication No. 2016/0359364, filed on Jun. 3, 2016, the entire contents of which are hereby incorporated by reference. Similar to a server cluster, a collection of energy storage devices may include of one or more equipment racks, each hosting a stack of energy storage modules, arranged within an enclosed space (e.g., a building or enclosure). The examples described herein relate primarily to such energy storage systems, although it should be understood that the concepts described herein may apply to other collections of heat dissipating components.

Regardless of the specific application, a large collection of rack-mounted heat dissipating components may dissipate a significant amount of heat, which needs to be conveyed away from the components to prevent the components from overheating. Existing component designs may rely upon multiple fan assemblies to convey the dissipated heat away. A common technique is to include one or more fan assemblies within each of the rack-mounted components to force air through or around that component.

The overall enclosed equipment area is typically treated by a cooling system (e.g., a High Volume Air Conditioning (HVAC) system) to maintain the ambient temperature within the enclosure to within a desired range. Standard practice may require a significant separation between HVAC air supply and return ports, which requires ducting and limits applicability in narrow enclosed systems where such a separation may not be possible. Alternatively, and also not desirably, the number of installed racks may be required to be limited to achieve the required separation in the available space.

SUMMARY OF THE INVENTION

The described embodiments are directed to a component cooling system configured to cool a collection of components, mounted within one or more racks, arranged in a stacked configuration in an enclosed space.

Embodiments of the cooling system may incorporate one or more of the following elements to provide improvements over the prior art. This list is not intended to be exhaustive, but is meant to provide examples of certain aspects of the invention. Other aspects not in this list may be described elsewhere herein:

An air plenum, disposed at the rear portion of each rack of heat dissipating components, to create an air channel along the rear portion of the components.

Structures configured to facilitate movement of cool air from the plenum to the stack of components that are to be cooled, such as a series or pattern of holes in the plenum placed such that cool air is blown into or around the components that need to be cooled.

One or more air mover(s) (e.g., a fan assembly) disposed at the bottom of each rack, to pull air from outside of the rack and force the air into the plenum, thereby pressurizing the air channel along the rear portion of the components.

Two or more rows of racks arranged within an enclosure, each pair of rows surrounds a volume of air (e.g., an aisle) between the rows.

One or more air cooling system(s), disposed on the enclosure, configured to (i) receive warm air rising from the volume between rows of racks, (ii) cool the warm air to produce cool air, and (iii) provide the cool air into the volume between rows of racks.

A cool air duct, connected to a cool air port of the air cooling system and extending part way down into the volume between the rows of racks in the enclosure.

Because cool air is denser than warm air, cool air tends to flow (through the operation of convection) to the bottom of the volume between the rows of racks. The cool air duct prevents mixing of the less dense warmer air at the top of the volume with the cool air produced by the air cooling system. The dense, cool air, conveyed by the cool air duct, flows to the bottom of the volume near the bottom of the racks.

Because an air mover is disposed at the bottom of each rack, the air that the air mover takes from outside the rack and uses to pressurize the rack's air plenum, tends to be cool air relative to other regions of the volume between rows of racks.

The described embodiments may include a single air mover, located at the bottom of each rack, thereby reducing or eliminating the need for multiple air movers disposed in each of the components.

The pressurized air plenum distributes cool air to each heat dissipating component in the rack, directed from the rear of each component to the front of the component. Cool air flows through or around the components from rear of the rack to the front of the rack. The cool air from the plenum absorbs heat from the component, as the cool air passes through or around the component, so that the temperature of the air exiting the front of the rack is higher than the air exiting the air plenum through or around the components The warm air exiting the front of the rack, being less dense than the cool air generated by the air cooling system, tends to rise to the top of the volume between the rows of racks. The air cooling system withdraws this warm air at the top of the volume, through one or more warm air ports, and cools the warm air through one or more refrigeration cooling systems using any one of many technologies and processes well-known in the art.

In one aspect, the invention is a system for cooling components, comprising an enclosure, and an air cooling system configured to receive warm air from within the enclosure through a warm air port in an enclosure ceiling, cool the warm air to produce cooled air, and provide the cooled air into the enclosure through a cool air port in the enclosure ceiling. The system further comprises one or more racks disposed within the enclosure. Each rack comprises a stacked arrangement of heat dissipating components mounted to the rack, an air plenum covering a rear opening of the rack, thereby forming an air channel along a rear portion of each component in the rack, and an air mover disposed at a bottom of the rack. The air mover is configured to pull air from outside of the rack, and to force the air into the air plenum to pressurize the air plenum. For each rack, the stacked arrangement of heat dissipating components may be configured to direct a flow of air from the pressurized air plenum into or around the heat dissipating components to outside of the rack in front of the components. The stacked arrangement of heat dissipating components may be configured to facilitate a flow of air from the pressurized air plenum at the rear portion of each component to a front portion of each component.

In embodiments, the stacked arrangement of heat dissipating components may include a component configured to facilitate the flow of air by incorporating an air flow path through the component. An opening at the rear portion of the heat dissipating component may be disposed on a first side of the component, and one or more channels within the component may be configured to direct the air flow path through the component from the first side of the component to a second side of the component, and from the rear portion of the component to the front portion of the component.

The stacked arrangement of heat dissipating components may be configured to facilitate the flow of air by incorporating an air flow path between adjacent pairs of components. The air mover may be a variable-speed fan. For each of the one or more racks, the air mover may be the only active component included in the rack to facilitate the flow of air.

The stacked arrangement of components may further comprise a stack of at least three battery module components. The stacked arrangement of components may include a battery management module component.

The system of claim 1, wherein the air cooling system is attached on top of and outside of the enclosure. A cool air duct may be attached to the cool air port within the enclosure and extending from the cool air port toward an enclosure floor. The cool air duct may have an outlet disposed above the floor of the enclosure and on a front opening side of the one or more racks. The outlet may be disposed above the floor within a range of 40 to 60 percent of a floor to ceiling distance. The cool air duct may be fabricated from a flexible material.

The one or more racks may include a first row of racks disposed side-by-side along a first side of the enclosure, and a second row of racks disposed side-by-side along a second side of the enclosure. Each rack may have its air plenum adjacent to its respective enclosure side.

The one or more racks may include a first row of racks and a second row of racks, arranged back-to-back, such that each of the racks of the first row has its air plenum adjacent to an air plenum of a rack of the second row of racks.

In another aspect, the invention is a method of cooling a rack of heat dissipating components, comprising cooling air, and directing the cooled air into a volume in front of the rack from above the volume. The method further comprises moving the cooled air, with an air mover disposed at a bottom portion of the rack, from the volume in front of the rack to a plenum at a rear portion of the rack to pressurize the plenum. The method also comprises flowing air from the plenum past or through (or both) the heat dissipating components in the rack to the volume in front of the rack, solely by force of pressure in the plenum, and drawing warmed air from an upper portion of the volume in front of the rack to once again cool the warmed air.

The method may further include flowing air from the plenum into a passage formed through each heat dissipating component, from an opening at a rear portion of the component to an opening at the front portion of the component. The method may further include flowing air from the plenum into a space between adjacent heat dissipating components, from a rear portion of the adjacent components to a front portion of the adjacent components. The air may be cooled by an air cooling system disposed on top of an enclosure enclosing the rack and the volume. The method may include providing cooled air into the enclosure through a cool air duct extending from the cool air port toward a floor of the enclosure, the cool air duct having an outlet disposed above the floor on a front opening side of the one or more racks.

The method may include disposing a first row of racks along a first side of the enclosure, and disposing a second row of racks along a second side of the enclosure. Each of the rows of racks may have its air plenum adjacent to its respective enclosure side, and its front opening side facing toward a front opening of another rack. The method may further include providing the cooled air into the enclosure between the first row of racks and the second row of racks.

In another aspect, the invention is a method of cooling a plurality of heat dissipating components, comprising arranging the plurality of components in a stacked configuration within one or more racks. Each rack may have an air plenum attached to the rack, the air plenum covering a rear opening of the rack, thereby forming and facilitating an air channel around an exterior surface of each component in the rack. The method further includes encapsulating the one or more racks within an enclosure, receiving warm air from within the enclosure through a warm air port in the ceiling, cooling the warm air to produce cooled air, and providing the cooled air into the enclosure through a cool air port in the ceiling. The method also includes pulling the cooled air from a location outside of and at the bottom of the rack, and forcing the cooled air into the air plenum to pressurize the air plenum.

The method may further include flowing air from the plenum into a passage formed through each component, from an opening at a rear portion of the heat dissipating component to an opening at the front portion of the component. The method may also include flowing air from the plenum into a space between adjacent components, from a rear portion of the adjacent components to a front portion of the adjacent components. A cool air duct may extend from the cool air port toward a floor of the enclosure, the cool air duct having an outlet disposed above the floor on a front opening side of the one or more racks.

In another aspect, the invention is a system for cooling components, comprising a rack that includes a stacked arrangement of heat dissipating components mounted in the rack, an air plenum in a rear portion of the rack. The configuration of the air plenum, in conjunction with the rack and components, form an air channel along a rear portion of each component in the rack. The system also includes an air mover disposed at the bottom of the rack. The air mover may be configured to pull air from outside of the rack, and to force the air into the air plenum to pressurize the air plenum. The stacked arrangement of components may be configured to facilitate a flow of air from the pressurized air plenum at the rear portion of each component to a front portion of each component.

The stacked arrangement of heat dissipating components may include a component configured to facilitate the flow of air by incorporating an air flow path through the component.

An opening at the rear portion of the heat dissipating component is disposed on a first side of the component, and one or more channels within the component are configured to direct the air flow path through the component, from the first side of the component to a second side of the component, and from the rear portion of the component to the front portion of the component.

In another aspect, the invention is a system for cooling battery components, comprising an enclosure, and an air cooling system configured to receive warm air from within the enclosure through a warm air port in an enclosure ceiling, cool the warm air to produce cooled air, and provide the cooled air into the enclosure through a cool air duct extending into the enclosure toward an enclosure floor, the cool air duct having an outlet disposed above the enclosure floor within a range of 40 to 60 percent of a floor to ceiling distance. The system further includes racks disposed within the enclosure. The racks may include a first row of racks disposed along a first side of the enclosure, and a second row of racks disposed along a second side of the enclosure. Each rack may have its air plenum adjacent to its respective enclosure side and having its front portion facing a volume. Each rack may include a stacked arrangement of at least three battery components mounted to the rack, and an air plenum in the rear opening of the rack. The stacked arrangement and air plenum may be configured to form an air channel along a rear portion of each battery component in the rack. Each rack may further include an air mover disposed at the bottom of the rack. The air mover may be configured to pull air from the volume, and to force the air into the air plenum to pressurize the air plenum. The stacked arrangement of battery components may be configured to facilitate a flow of air from the pressurized air plenum at the rear portion of each component to a front portion of each component, and into the volume between rows of racks.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 4A, 4B and 4C illustrated an exploded view of a single equipment rack constructed according to the invention.

DETAILED DESCRIPTION OF THE INVENTION

A description of example embodiments of the invention follows.

The teachings of all patents, published applications and references cited herein are incorporated by reference in their entirety.

Figure 1A:
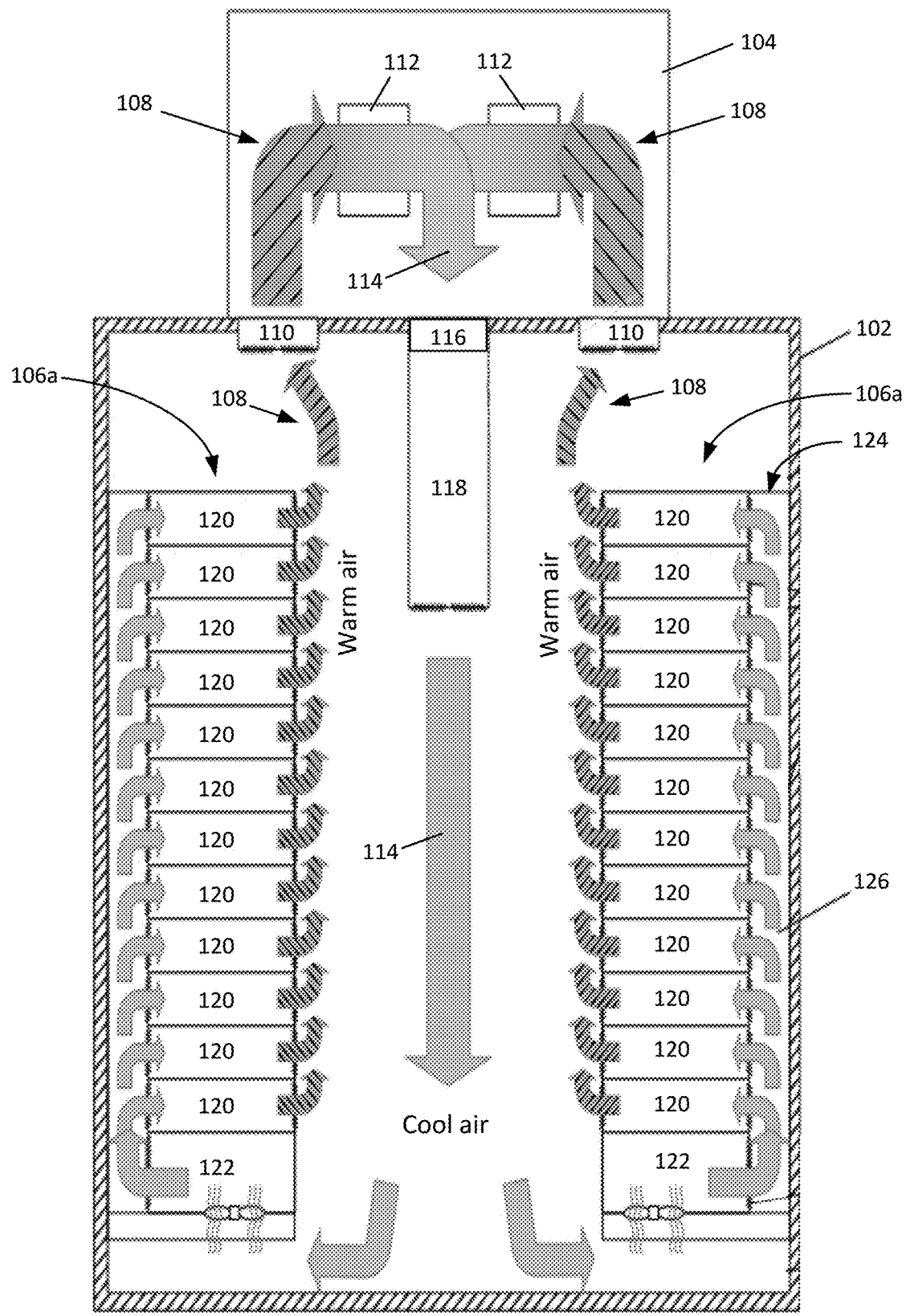
FIGS. 1A through 1D illustrate various example embodiments of a component cooling system according to the invention.

FIG. 1A illustrates an example embodiment of a component cooling system 100 according to the invention. The component cooling system 100 comprises an enclosure 102, an air cooling system 104, and two equipment racks 106a, 106b.

In at least one embodiment, the air cooling system 104 may be mounted on the top of, and outside of, the enclosure 102. The air cooling system 104 may receive warm air 108 from the enclosure 102 through at least one warm air port 110 located at the top of the enclosure 102, and cool the received warm air 108 by passing the received warm air 108 through at least one air cooling unit 112. The cool air 114 produced by the air cooling unit 112 is channeled back into the enclosure 102 through at least one cool air port 116 located at the top of the enclosure 102. In the figures describing the example embodiments, the flow of cool air 114 is shown with plain shaded arrows, while the flow of heated air 108 is shown with cross-hatched shaded arrows.

A cool air duct 118, attached to the cool air port 116, extends at least part way down into the enclosure 102 toward the enclosure floor. The cool air duct 118 isolates the cooled air 114 from the warm air 108 in the upper portions of the enclosure 102 to prevent mixing of the warm air 108 and the cool air 114. This isolation of warm air from cool air may increase the overall thermal efficiency of the overall air component cooling system 100.

In at least one embodiment, the outlet of the cool air duct 118 may be disposed within a range of 40% to 60% of a floor-to-ceiling distance, although other embodiments may have the outlet of the cool air duct disposed in other floor-to-ceiling ranges. The cool air duct may be fabricated from a flexible material such as cloth or soft plastic. Such a flexible material may be advantageous for ensuring the safety of personnel working within the enclosure, in case the personnel inadvertently bumps into the cool air duct 118.

Each equipment rack 106a, 106b includes two or more heat dissipating components 120 configured in a stacked arrangement. Each of the racks 106a, 106b includes a front opening and a rear opening. The front opening exposes the front portion of each heat dissipating component 120, and the rear opening exposes the rear portion of each heat dissipating component 120. The heat dissipating components 120 may comprise any device capable of dissipating heat energy. In an example embodiment, the heat dissipating components may include battery modules or other energy storage elements. Each equipment rack 106a, 106b may include three or more such battery modules. In some embodiments, the heat dissipating component may comprise a battery management module for controlling, balancing and otherwise managing a set of battery modules.

Each rack 106a, 106b further includes an air mover 122 disposed at the bottom of the rack. The air mover 122 may comprise a module with a footprint similar to that of a heat dissipating component, so that the air mover may be mounted to the rack with attachment hardware similar to that used to attach the heat dissipating components 120 to the equipment rack, although other form factors of the air mover 122 may alternatively be used. The air mover 122 may further comprise a fan having pitched blades attached to a rotatable axle as is known in the art. The fan may be a variable speed fan that changes a rate of air flow through the air mover 122, based upon a control input. The control input may respond to one or more temperature sensors within the enclosure 102 and/or the rack 106. The air mover 122 may alternatively comprise other mechanisms known in the art for causing air to flow across a pathway.

In some embodiments, the air mover 122 disposed at the bottom of each rack 106a, 106b is the only active component included in the rack to facilitate a flow of air through the heat dissipating components 120. In such embodiments, no other fans or air movers are required to be deployed within the individual heat dissipating components to facilitate or otherwise assist a flow of air through the components 120.

The air mover 122 pulls air from the bottom portion of the enclosure (i.e., at the floor of the enclosure) and forces the air into an air plenum 124 mounted to the rear opening of the respective rack 106a, 106b. The air plenum 124 is a covering that creates an air channel 126 behind the stack of two or more heat dissipating components 120. The locations where the air plenum 124 contacts the rack 102 are configured to be air-tight or nearly air-tight, so that when the air mover 122 pressurizes the air plenum (by forcing air into the air channel 126), the only path for the pressurized air is through openings in the rear portions of the heat dissipating components 120 and through and/or around the heat dissipating components 120.

Figure 1B:
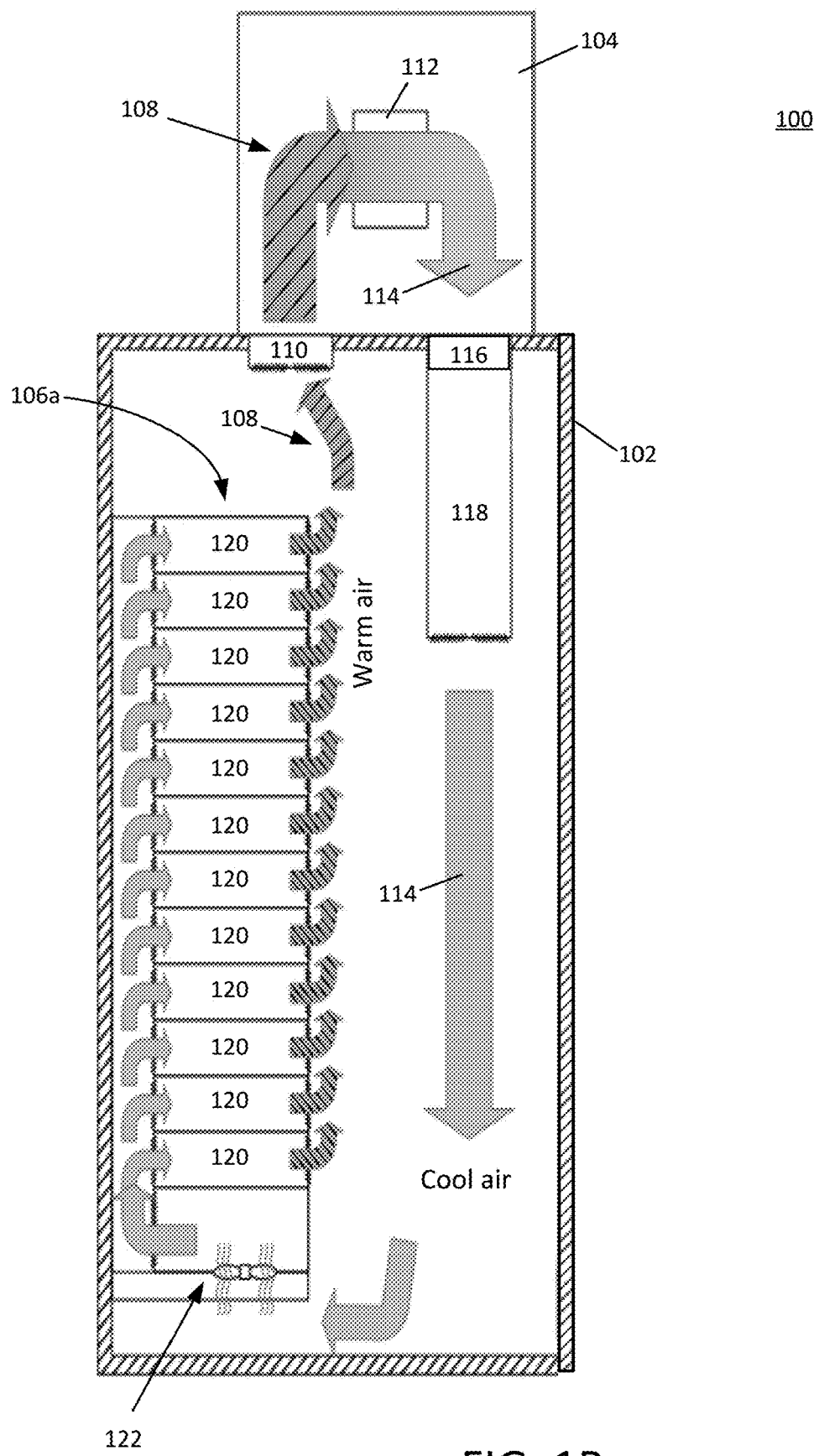

The example embodiments of FIGS. 1A and 1B show the racks 106a, 106b with a space between air mover 122 and the bottom of the enclosure 102, such that the air mover 122 draws air from directly underneath the rack 106a, 106b. In other embodiments, the racks 106a, 106b may be situated directly on the enclosure floor, with no space beneath, so that the air mover 122 draws air from the front of the bottom of the rack rather than underneath the rack. An example of such an alternative embodiment is shown in FIG. 1D.

Figure 2A:
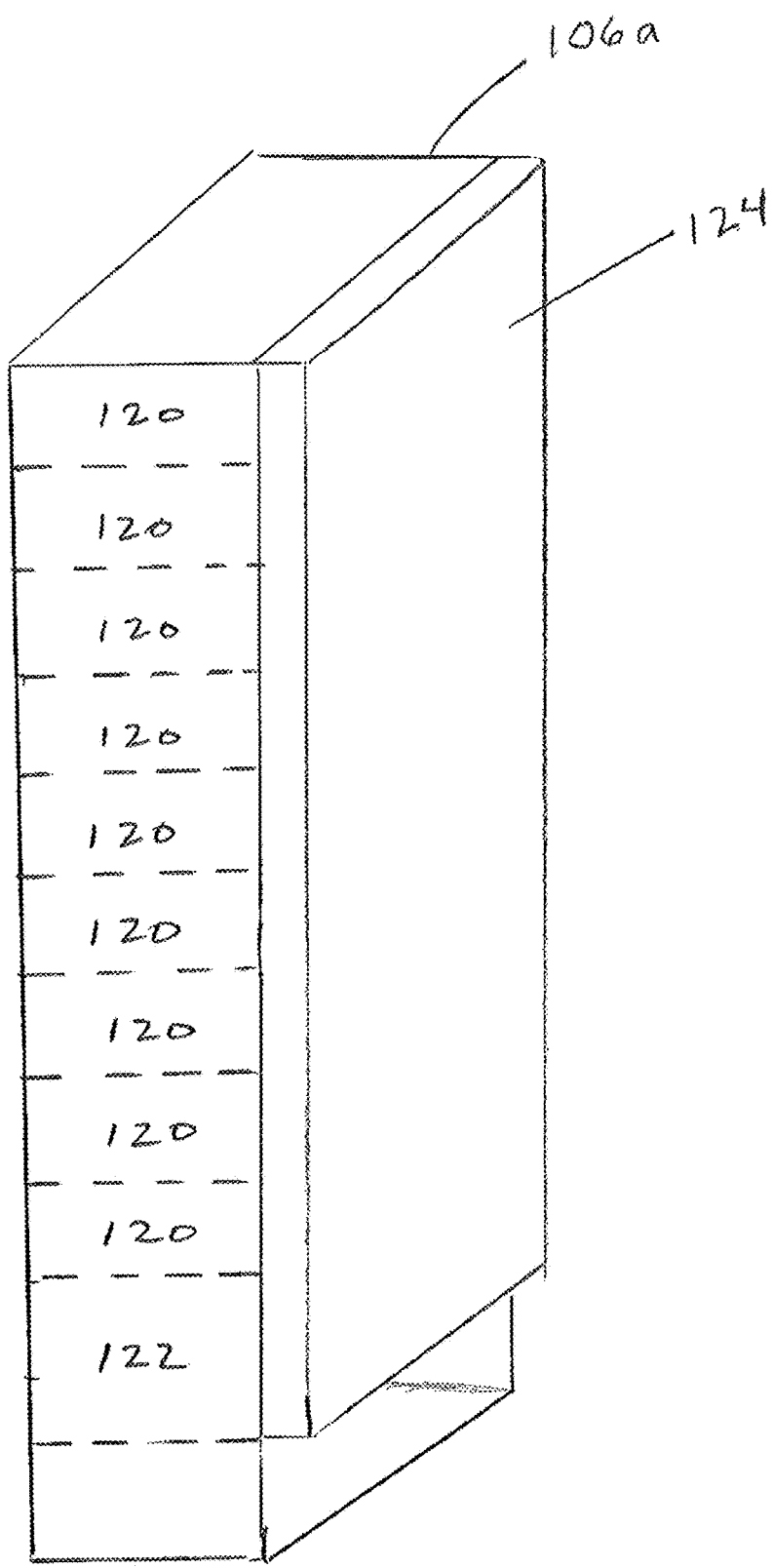
FIG. 2A shows a perspective view of an example embodiment of a component cooling system according to the invention.
Figure 2B:
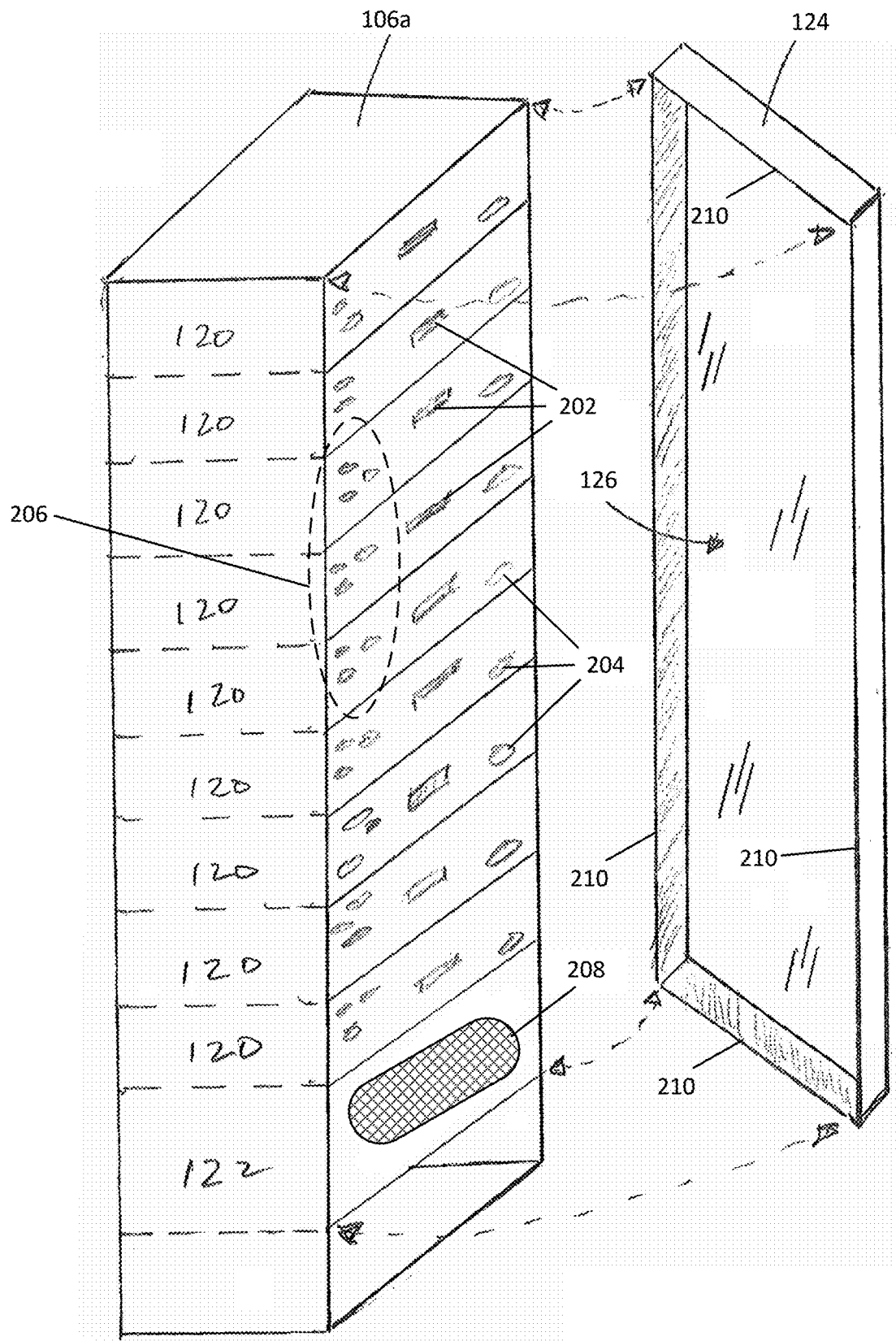
FIG. 2B shows the embodiment of FIG. 2A with the air plenum removed.

FIG. 2A shows a perspective view of the equipment rack 106a, showing the air plenum 124 attached to the rear portion of the rack 106a. FIG. 2B illustrates a perspective view of the equipment rack 106a with the air plenum removed. The rear portion of each heat dissipating component 120 is exposed in the FIG. 2B view, with various connectors 202, control features 204 (e.g., switches, buttons) and air inlet ports 206 shown. It should be understood that these are only examples of the types of features that may be seen on the rear portion of an heat dissipating component mounted in a rack and are not intended to be limiting.

The air mover 122 may further comprise one or more air outlet ports 208, through which the air mover 122 drives cool air into the air channel 126 formed when the plenum is attached to the rack 106a.

Although the air plenum 124 in the example embodiments are shown as a rectangular, box-shaped item, it should be understood that the air plenum 124 may be formed in alternative shapes, provided that the plenum creates the sealed, airtight (or nearly so) air channel 126 behind the heat dissipating components 120 as described herein. Further, it should be understood that the air plenum edge 210 (which contacts the rack 106a when the air plenum 124 is attached to the rack 106a) may include a gasket, or other sealing agent, attached thereto, to reinforce the seal between the air plenum 124 and the rack 106a.

Referring again to FIG. 1A, the air mover 122 pulls cool air, which is at enclosure-ambient pressure, from the bottom of the enclosure 102, and forces the cool air into the air channel 126 formed by the air plenum 124, thereby pressurizing the air plenum 124 to a pressure above enclosure-ambient pressure. The pressurized air plenum causes a flow of air through or around each heat dissipating component 120 to the lower pressure region at the front portion of the heat dissipating component 120 which is in the region between the equipment racks 106a, 106b.

The heat dissipating components 120 may be configured to include intake ports, exit ports, air channels, pathways, baffles, and other features to cause air to pass through or around the heat dissipating component 120 efficiently. In one embodiment, the rear portion of the heat dissipating component may include one or more intake ports distributed across the rear face of the heat dissipating component 120. In another embodiment, one or more intake ports may be disposed on one side of the rear face of the heat dissipating component, with an exit port disposed on the opposite side at the front face of the heat dissipating component 120.

Figure 2C:
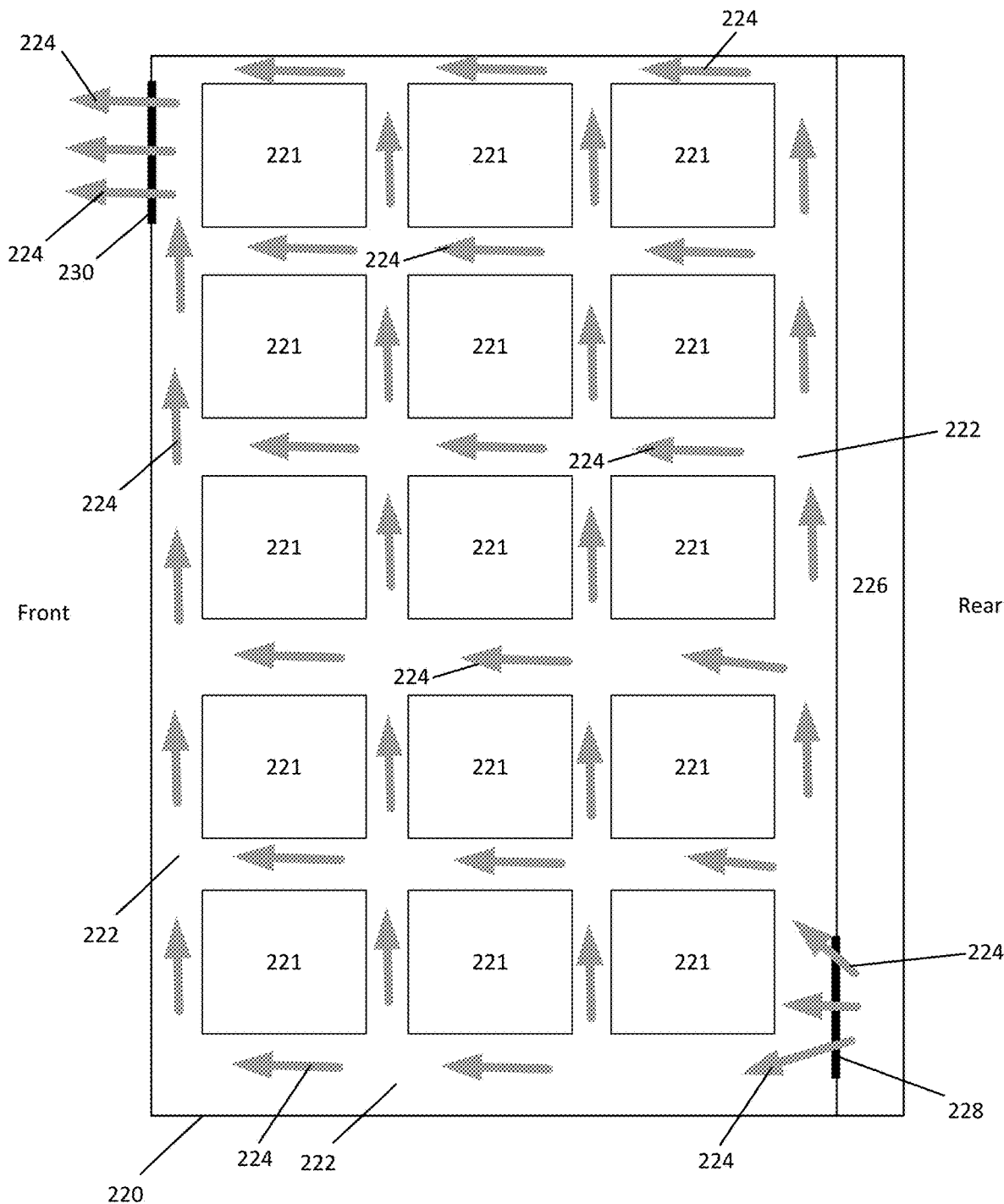
FIG. 2C shows a top cross-sectional view of an example embodiment of a heat dissipating component according to the invention.

FIG. 2C illustrates a top cross-sectional view of an example embodiment of an heat dissipating component 220 containing sub-components 221. The view in FIG. 2C shows air channels 222 through the component 220, allowing a flow 224 of air to pass from the air plenum 226, through a rear intake port 228, through the channels 222, and to an exit port 230 to exit at the front of the heat dissipating component 220. For clarity, only some air flow 224 indicators (shaded arrows) and channels 222 are labeled.

Figure 2D:
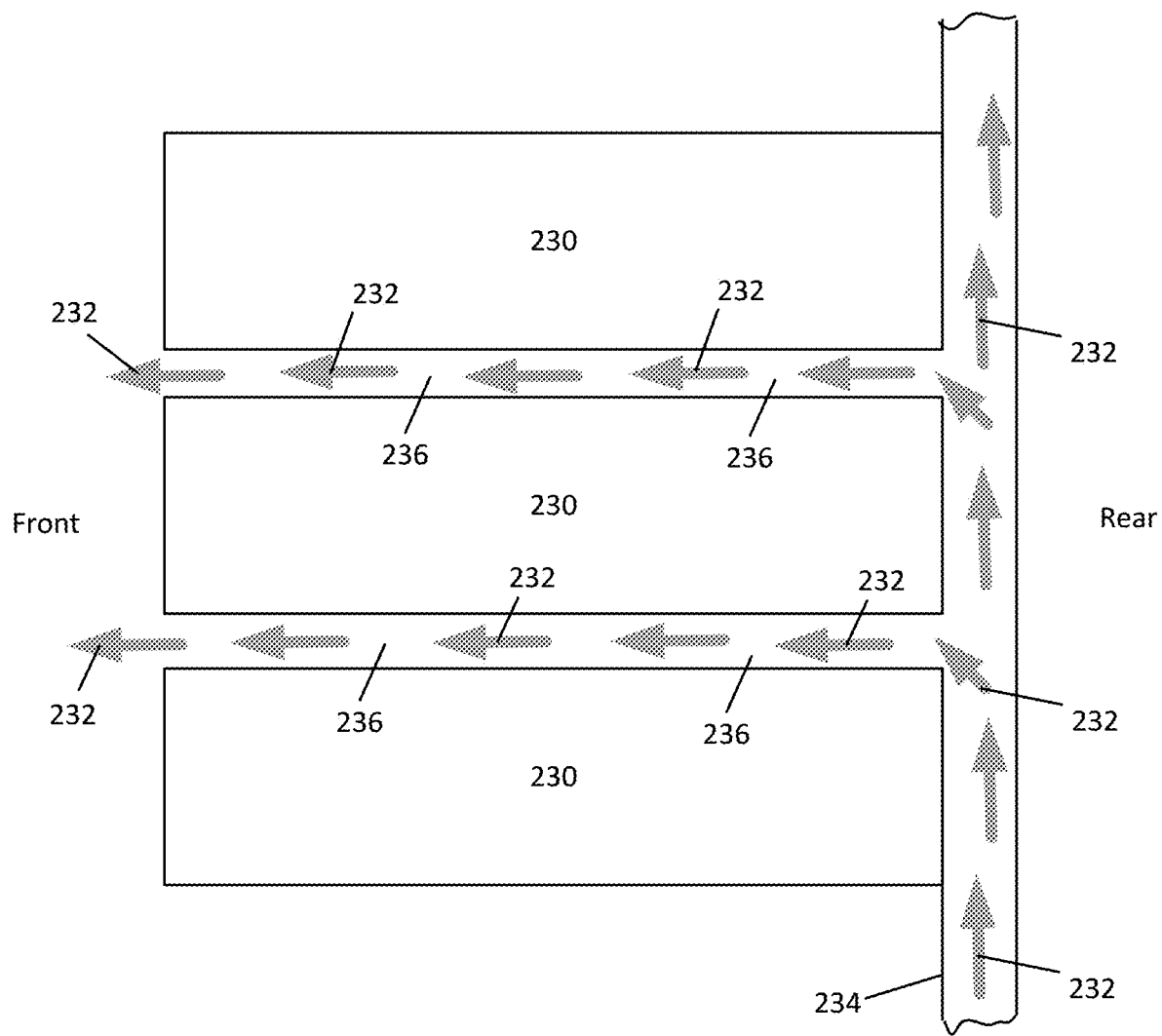
FIG. 2D shows a side sectional view of an example embodiment of three stacked components in a rack according to the invention.

FIG. 2D illustrates a side sectional view of an example embodiment of three stacked heat dissipating components 230 in a rack, configured so that air passes between the devices from the rear of the component 230 to the front of the component. Although only three heat dissipating components are shown in this example embodiment, the concept can be extended to more heat dissipating components. The view in FIG. 2D shows a flow 232 of air passing from the air plenum 234 through the channels 236 formed by a top 238 and a bottom 240 of adjacent components 230, and the rack sides (not shown) to which the components 230 are attached.

The example embodiments shown in FIGS. 2C and 2D are presented to demonstrate ways that a flow of air may be employed to cool components, and are not meant to be limiting. Other configurations of air channels and pathways associated with the components to be cooled may be used instead of or in addition to the configurations described above. Further, a configuration that passes air through the component, as in FIG. 2C, may be used in combination with a configuration that passes air along the exterior surfaces of the component, as in FIG. 2D.

The cool air that originates from the air channel 126 may absorb heat energy dissipated from the heat dissipating component 120 (and/or sub-components within the heat dissipating component 120), as the cool air passes through the component 120, thereby raising the temperature of the air passing through the heat dissipating component 120. The temperature of the air exiting the heat dissipating component 120 is therefore higher than the air entering the component 120 from the air plenum. The air channels, pathways, baffles, and other features for conveying air through the heat dissipating component 120 may further be designed to cause heat energy to be efficiently transferred from the heat dissipating component 120 and sub-components to the air passing through the component 120.

The warm air exiting the heat dissipating component 120, being less dense than the cool air generated by the air cooling system 104, tends to rise to the top of the enclosure 102 due to thermal convection. The air cooling system 104 withdraws the warm air 108 at the top of the enclosure 102, through one or more warm air ports 110, and cools the warm air 108 through one or more cooling units 112 known in the art. In an example embodiment, each of the cooling units may be a compression/expansion refrigeration cycle system, although other cooling systems known in the art may be used instead of or in addition to a compression/expansion refrigeration cycle system.

In other embodiments, the cool air may flow between adjacent pairs of heat dissipating components 122, instead of (or in addition to) flowing through the heat dissipating components 122.

Figure 1C:
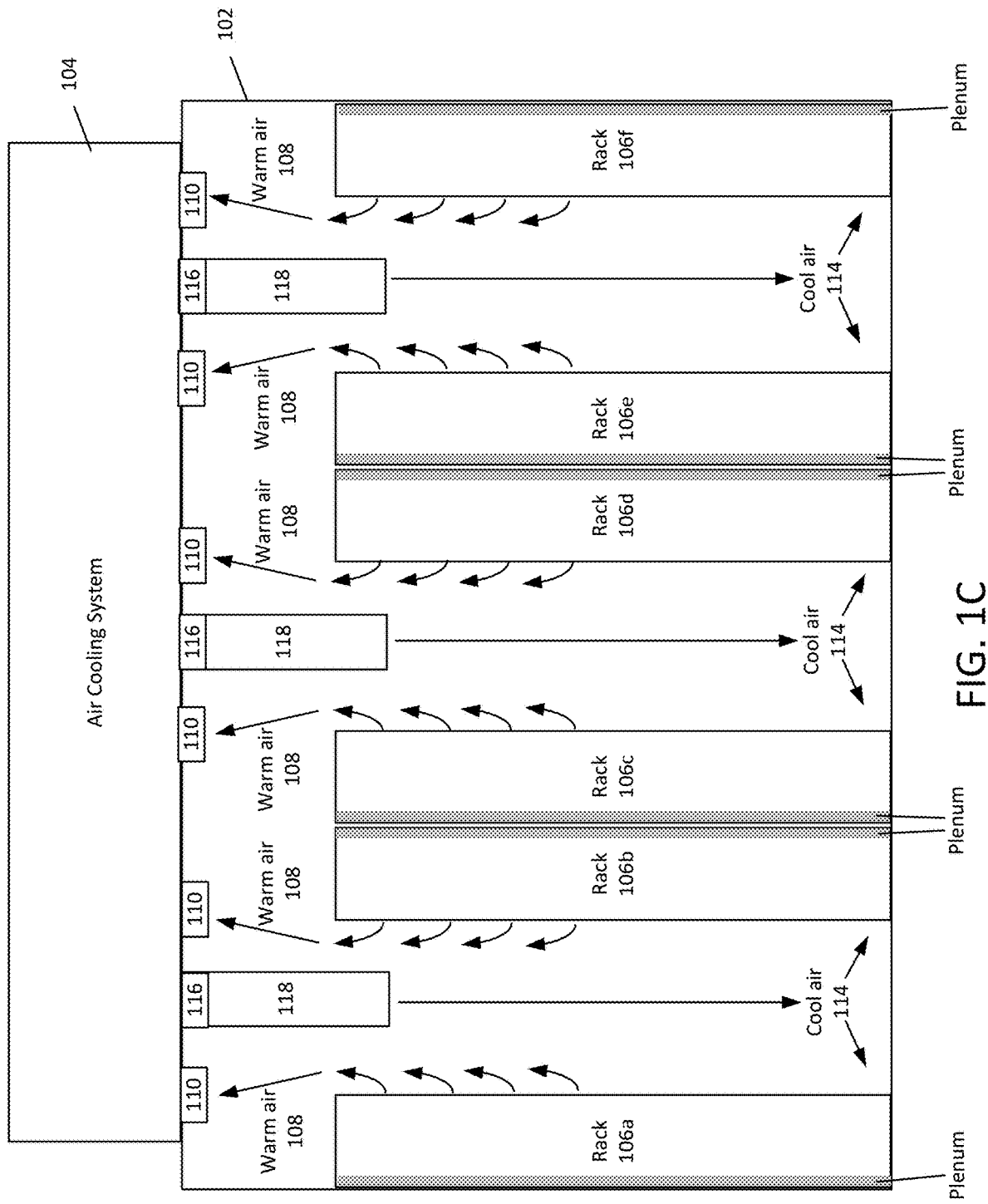
Figure 1D:
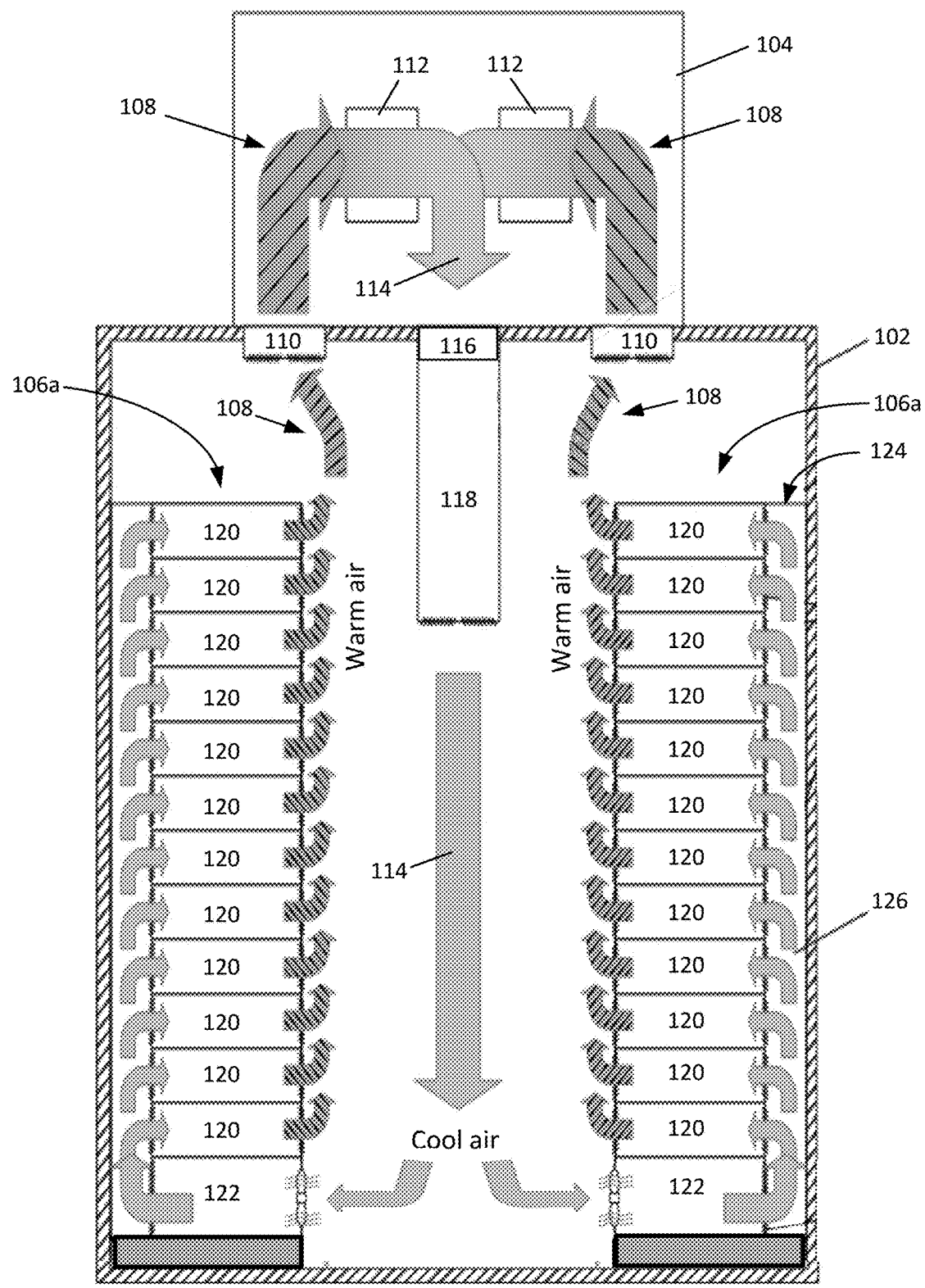

The example embodiment shown in FIG. 1A illustrates two equipment racks 106a and 106b, although it should be understood that the concepts described herein are applicable with one equipment rack, as shown in the example embodiment of FIG. 1B, or with more than two equipment racks 106a through 106f, as shown in the example embodiment of FIG. 1C. The embodiment of FIG. 1C includes certain pairs of racks configured back-to-back, such that the plenum of one back-to-back rack is adjacent to the plenum of the other back-to-back rack.

Figure 3:
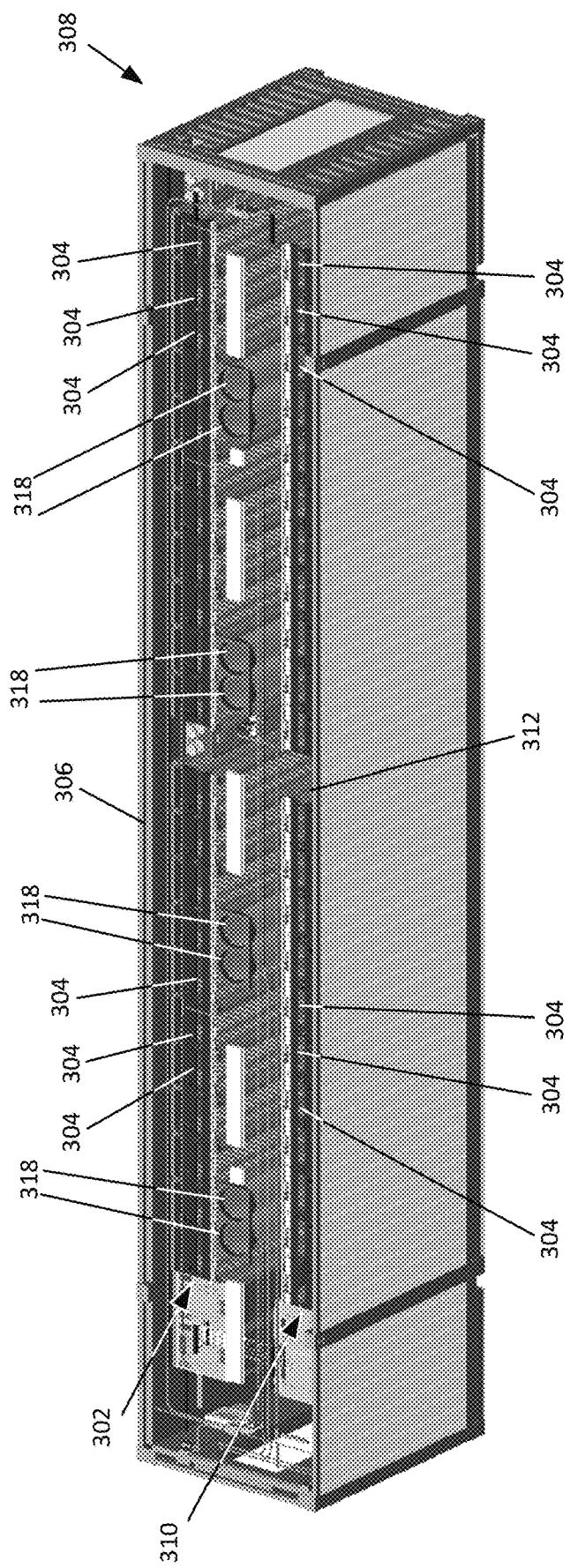
FIG. 3 illustrates a perspective view of an embodiment consistent with the embodiment of FIG. 1A.

It should also be understood that the equipment racks shown in FIGS. 1A through 1D may represent only individual racks from a row of racks. For example, FIG. 3 illustrates a perspective view of an embodiment consistent with the embodiment of FIG. 1A, having two parallel rows of equipment racks within an enclosure. As shown in FIG. 3, a first row 302 of racks 304 is situated against one long side wall 306 of the enclosure 308, and a second row 310 of racks 304 is situated against another long side wall 312 of the enclosure 308. The view shown in FIG. 3 has the ceiling of the enclosure 308 and the cooling system removed, to allow the rows of racks to be seen. Also, for clarity, only some of the racks 304 are labeled with reference numbers. In the embodiment of FIG. 3, the racks 304 within each row 302, 310 are arranged side by side with the rear portion of each rack (i.e., the plenum) adjacent to the enclosure side wall 306, 312. Pairs of cool air ducts 318, disconnected from the associated cool air ports in the enclosure ceiling, are shown extending down into the enclosure between the rows 302, 310 of racks 304. The concept of rows of racks within an enclosure, demonstrated in FIG. 3, can be extended to embodiments of more than two rows as depicted for example in FIG. 1C.

FIG. 4A shows a front view of a single example equipment rack 402 constructed according to the invention. This example embodiment has 16 battery modules 404, and one battery management module 405, arranged in a stacked configuration, with a single air mover module 406 disposed at the bottom of the rack 402.

FIG. 4B is a more detailed view of the bottom of the rack 402 shown in FIG. 4A. The view of FIG. 4b shows four of the battery modules 404, and the air mover module 406 is shown partially extracted from the rack 402. Each module 404, 406 may be individually extracted for replacement, repair or other maintenance as required.

FIG. 4C shows the air mover module 406 partially disassembled, with the cover 408 removed, exposing the electric rotary 2 fan assembly 410. The fan assembly 410 pulls air through a first aperture 412 in the bottom of the air mover module 406, and forces the air through a second aperture 414 and into the air plenum (not shown).

In each disclosed embodiment, the use of a single air mover for each rack, rather than one for each component or module, allows for a less expensive system while using a relatively high quality air mover for greater efficiency, reliability and longer life. To that end, the air plenum is dimensioned such that the pressure drop through the height of the air plenum is low relative to the pressure drop across each component or module. The resistance to air flow through the components or modules is generally the same but may be varied to control relative flow through the components or modules.

While this invention has been particularly shown and described with references to example embodiments thereof, it will be understood by those skilled in the art that various changes in form and details may be made therein without departing from the scope of the invention encompassed by the appended claims.

What is claimed is:

1. A system for cooling components, comprising:
   an enclosure;
   an air cooling system configured to receive warm air from within the enclosure through a warm air port in an enclosure ceiling, cool the warm air by passing the received warm air through an air refrigeration cooling unit to produce cooled air, and provide the cooled air into the enclosure through a cool air port in the enclosure ceiling;
   one or more racks disposed within the enclosure;
   for each rack:
   (i) a stacked arrangement of heat dissipating components mounted to the rack;
   (ii) an air plenum covering a rear opening of the rack, thereby forming an air channel along a rear portion of each component in the rack;
   (iii) an air mover disposed at a bottom of the rack, the air mover configured to pull air from outside of the rack, and to force the air into the air plenum to pressurize the air plenum;
   (iv) the stacked arrangement of heat dissipating components configured to direct a flow of air from the pressurized air plenum into or around the heat dissipating components to outside of the rack in front of the components;
   the stacked arrangement of heat dissipating components configured to facilitate a flow of air from the pressurized air plenum at the rear portion of each component to a front portion of each component; and
   a cool air duct attached to the cool air port within the enclosure and configured to extend from the cool air port into the enclosure toward an enclosure floor to isolate the cooled air flowing in the cool air duct from the warm air located at a ceiling portion of the enclosure, the cool air duct having an outlet disposed above the floor of the enclosure to thereby expel the cooled air to a floor portion of the enclosure, and the air mover disposed at the bottom of each rack is configured to pull the cooled air from the floor portion of the enclosure and force the cooled air into the respective air plenum.

2. The system of claim 1, wherein the stacked arrangement of heat dissipating components includes a component configured to facilitate the flow of air by incorporating an air flow path through the component.

3. The system of claim 2, wherein an opening at the rear portion of the heat dissipating component is disposed on a first side of the component, and one or more channels within the component are configured to direct the air flow path through the component from the first side of the component to a second side of the component and from the rear portion of the component to the front portion of the component.

4. The system of claim 1, wherein the stacked arrangement of heat dissipating components is configured to facilitate the flow of air by incorporating an air flow path between adjacent pairs of components.

5. The system of claim 1, wherein the air mover is a variable-speed fan.

6. The system of claim 1, wherein for each of the one or more racks, the air mover is the only active component included in the rack to facilitate the flow of air.

7. The system of claim 1, wherein the stacked arrangement of components comprises a stack of at least three battery module components.

8. The system of claim 7, wherein the stacked arrangement of components includes a battery management module component.

9. The system of claim 1, wherein the air cooling system is attached on top of and outside of the enclosure.

10. The system of claim 1, wherein the outlet is disposed above the floor within a range of 40 to 60 percent of a floor to ceiling distance.

11. The system of claim 1, wherein the cool air duct is fabricated from a flexible material.

12. The system of claim 1, wherein the one or more racks includes a first row of racks disposed side-by-side along a first side of the enclosure, and a second row of racks disposed side-by-side along a second side of the enclosure, each rack having its air plenum adjacent to its respective enclosure side.

13. The system of claim 1, wherein the one or more racks includes a first row of racks and a second row of racks being arranged back-to-back, such that each of the racks of the first row has its air plenum adjacent to an air plenum of a rack of the second row of racks.

14. A system for cooling components, comprising:
an enclosure;
an air cooling system configured to receive warm air from within the enclosure through a warm air port in an enclosure ceiling, cool the warm air to produce cooled air, and provide the cooled air into the enclosure through a cool air port in the enclosure ceiling;
a rack including (i) a stacked arrangement of heat dissipating components mounted in the rack, (ii) an air plenum in a rear portion of the rack, thereby forming an air channel along a rear portion of each component in the rack, and (iii) an air mover disposed at a rack bottom, the air mover configured to pull air from outside of the rack, and to force the air into the air plenum to pressurize the air plenum;
a cool air duct attached to the cool air port within the enclosure and configured to extend from the cool air port into the enclosure toward an enclosure floor to isolate the cooled air flowing in the cool air duct from the warm air located at a ceiling portion of the enclosure, the cool air duct having an outlet disposed above the floor of the enclosure to thereby expel the cooled air to a floor portion of the enclosure, and the air mover disposed at the bottom of each rack is configured to pull the cooled air from the floor portion of the enclosure and force the cooled air into the respective air plenum.

15. The system of claim 14, wherein the stacked arrangement of heat dissipating components includes a component configured to facilitate the flow of air by incorporating an air flow path through the component.

16. The system of claim 14, wherein an opening at the rear portion of the heat dissipating component is disposed on a first side of the component, and one or more channels within the component are configured to direct the air flow path through the component from the first side of the component to a second side of the component and from the rear portion of the component to the front portion of the component.

* * * * *